United States Patent [19]
Masreliez

[11] 3,989,961
[45] Nov. 2, 1976

[54] BIDIRECTIONAL RESET INTEGRATOR CONVERTER

[75] Inventor: C. Johan Masreliez, Redmond, Wash.

[73] Assignee: The Boeing Company, Seattle, Wash.

[22] Filed: June 16, 1975

[21] Appl. No.: 587,157

[52] U.S. Cl. .............................. 307/261; 307/228; 307/230; 307/235 N; 307/236; 307/262; 328/127
[51] Int. Cl.² .......................................... H03K 5/08
[58] Field of Search ............... 307/261, 262, 235 N, 307/260, 228, 229, 230, 236; 328/118, 127

[56] References Cited
UNITED STATES PATENTS

| | | | |
|---|---|---|---|
| 3,040,273 | 6/1962 | Boff | 307/228 X |
| 3,482,116 | 12/1969 | James | 307/262 X |
| 3,496,387 | 2/1970 | Saito | 307/260 |
| 3,697,780 | 10/1972 | Michael et al. | 307/235 N |
| 3,749,942 | 7/1973 | Moses | 307/261 X |
| 3,800,167 | 3/1974 | Smith | 307/261 X |

Primary Examiner—John S. Heyman
Attorney, Agent, or Firm—Christensen, O'Connor, Garrison & Havelka

[57] ABSTRACT

A bi-directional reset integrator converter, including a common reset pulse generator operable by input currents of either direction, is disclosed. The reset pulse generator creates a current flow through common components in either direction, the direction depending upon the direction of the input current. Upon receipt of a reset pulse request from the integrator of the converter, the common current flow path is connected to the integrating capacitor of the converter and dumps (or withdraws) a $Q = I \cdot \Delta T$ charge that reduces the magnitude of the capacitors stored voltage. Low asymmetry and good linearity result from the use of common components in the current flow path that provides the capacitor voltage reducing charge. In addition, good scale factor stability is provided by a temperature compensating bridge circuit.

16 Claims, 3 Drawing Figures

FROM HIGH SPEED
MOS DRIVERS
CONTROLLED BY THE
PULSE GENERATOR

3,989,961

BIDIRECTIONAL RESET INTEGRATOR CONVERTER

BACKGROUND OF THE INVENTION

This invention is directed to electronic conversion systems and, more particularly, to current (or voltage)-to-frequency converters.

In many electronic circuits and systems, precise current (or voltage)-to-frequency conversion is necessary. For example, in an inertial navigation system, the position of the vehicle is determined by measuring vehicle accelerations and angular rates from a starting point. Usually, accelerometers and gyroscopes are used to sense vehicle acceleration and angular rates. These devices produce electric current outputs whose magnitudes are (nearly) proportional to their respective input variables. In order for such electrical currents to be usable by a suitable information manipulating system, such as a digital computer, they must be first placed in a form suitable for use by such a system. One way to convert electrical current information into such a form is to convert the current information into frequency information. For example, the current information may be converted into a pulse train having a frequency rate proportional to the magnitude of the current at any particular point in time. The present invention is directed to a current-to-frequency (I/F) converter suitable for performing this function.

While the invention was developed for use in combination with precision accelerometers and gyroscopes used in inertial navigation systems, it will be readily appreciated by those skilled in the art and others that the invention is also suitable for use in other environments. Thus, the herein described invention should not be construed as limited to use in such environments. In addition, while the invention is described as adapted to convert current information into frequency information, it will readily be appreciated that current and voltage are interchangeable parameters when appropriate resistive elements are used. Thus, the invention is also useful as a voltage-to-frequency converter. As such, the term current, as used herein, is generic, i.e., it covers both current and voltage-to-frequency converters.

There are a number of constraints placed upon I/F converters useful in inertial navigation systems, and other similar environments. For example, when used in a strapped down inertial navigation system, an I/F converter must have an exceptionally wide dynamic range (typically $10^8$). In addition, it must have low bias drift, good linearity and good scale factor stability. Moreover, the asymmetry of the converter must be low, i.e., the difference in output frequency for input currents of opposite direction but equal in magnitude must be small (typically in the order of ±5 parts per million).

Prior to the present invention, these strict requirements have been met by using high stability components (resistors, amplifiers, switches, etc.) and by temperatures stabilizing the environment surrounding the converter. With respect to temperature stabilization, often the converter has been placed, either partially or entirely, inside of a temperature controlled oven. Even with these precautions, however, it has been difficult to meet the strict requirements noted above, particularly the requirement for low asymmetry.

Therefore, it is an object of this invention to provide a new and improved bi-directional converter.

It is also an object of this invention to provide a current (or voltage)-to-frequency converter that is suitable for use in environments wherein inputs currents may flow in either direction.

It is another object of this invention to provide a precision bi-directional converter having low asymmetry, good linearity, low bias drift, a wide dynamic range and good scale factor stability.

Reset integrator type current-to-frequency converters have been known for a number of years. Conversion is accomplished by letting the current to be converted charge a capacitor connected in the feedback loop of an integrating amplifier. When the output of the amplifier reaches a predetermined level the capacitor is partly discharged by injecting a charge of opposite polarity into the capacitor. The charge may be generated by using either the relationship $Q = V \cdot C$ or the relationship $Q = to\ I \cdot \Delta T$; where $V$ = voltage, $C$ = capacitance, $I$ = current and $\Delta T$ = time interval.

The first relationship noted above is normally carried out in a practical structure by providing a low impedance path connected in parallel with the charged capacitor and shorting the capacitor for timed intervals. More specifically, each time the capacitor is charged to some predetermined level, it is discharged for a predetermined time period by connecting it to the low impedance path. The problem with this approach is that the scale factor stability of the overall converter is dependent upon the stability of the capacitor and the reset voltage level. Not only is the scale factor unstable, it is also non-linear because the low impedance path across the capacitor also has the effect of short circuiting the input current during the reset (shorting) intervals.

The second relationship noted above avoids the problem of capacitor stability, and good linearity is obtained. However, systems utilizing this relationship in the past have not been satisfactory when the converter is to be used to convert bi-directional currents because two physically different circuits have been utilized to provide the $Q = I \cdot \Delta T$ charges, one for each current direction. In this regard, attention is directed to U.S. Pat. No. 3,040,273 issued June 19, 1962 to A. F. Boff, for Voltage To Frequency Converter. The primary disadvantage of such systems is that it is virtually impossible for them to achieve good asymmetry performance over a wide temperature range. In the past satisfactory, but not good, asymmetry has been obtained at the expense of placing such converters in a temperature controlled environment.

Therefore, it is yet another object of this invention to provide a current (or voltage)-to-frequency converter for converting currents of either direction that has good asymmetry over a wide temperature range.

It is still another object of this invention to provide a precision current-to-frequency converter that has good linearity, low asymmetry, good scale factor stability with temperature and operates over a wide dynamic range with low bias drift regardless of the direction of the current to be converted.

SUMMARY OF THE INVENTION

In accordance with principles of this invention, a precision bi-directional reset integrator converter is provided by the invention. The current, or voltage, to be converted is applied to an integrating capacitor connected in the feedback path of an amplifier. When the charge on the capacitor reaches a suitable level, either a positive or a negative limit switch, depending upon current direction, or voltage polarity, applies a reset pulse request to a reset pulse generator. The reset pulse generator, in turn, applies a charge to the charged capacitor that reduces its charge, i.e., reduces its magnitude toward zero. At the same time, the reset pulse generator generates an output pulse. Since the rate of pulse requests is, of course, directly related to the magnitude of the input current, or voltage, the output pulse rate is also directly related to input current magnitude.

In accordance with futher principles of this invention, the reset pulse generator includes a current path adapted to carry current through common components. The actual current direction with respect to the integrating capacitor is determined by the direction of the current to be converted. When a reset pulse request occurs, the common current path is connected to the integrating capacitor connected in the feedback path of the amplifier for a predetermined time period $\Delta T$. Thus, the capacitor voltage reducing charge Q is equal to $I \cdot \Delta T$, where $I$ is the current flowing in the common current path at the time of connection. Because the common current path is defined by common elements, the magnitude of the charge applied to reduce the voltage on the capacitor is the same regardless of the direction of the input current flow (or, more precisely the polarity of the reducing charge), whereby overall system operation is substantially exactly symmetrical.

In accordance with further principles of this invention, the reset pulse generator includes a high precision pulse generator adapted to receive the reset pulse request from the positive and negative limit switches adapted to sense the charge on the integrating capacitor. The reset pulse generator also includes a bi-polar voltage source including a pair of comparator amplifiers adapted to control current regulators forming part of the common current path. Current direction flow control devices control the direction of the flow of current with respect to the integrating capacitor. The current flow control devices are controlled by the direction of the input current.

In accordance with still further principles of this invention, a scale factor temperature compensation circuit, preferably formed of a temperature compensation bridge is included in the bi-polar voltage source to provide scale factor stability.

It will be appreciated from the foregoing summary that the invention provides a new and improved precision reset integrator converter. Because common components form the current path that provides the charge used to reduce the voltage on the integrating capacitor, good asymmetry performance over a wide temperature range is provided. Further, because a $Q = I \cdot \Delta T$ relation is utilized to provide the voltage reducing charge, capacitor stability problems are avoided and good linearity is obtained. Also, because the same pulse source is utilized to control the application of the voltage reducing charge to the integrating capacitor, regardless of the direction of the input current, the charge dumping interval is maintained uniform to further improve asymmetry. Finally, the inclusion of a temperature compensation circuit results in good scale factor stability.

BRIEF DESCRIPTION OF THE DRAWINGS

The foregoing objects and many of the attendant advantages of this invention will become more readily appreciated as the same becomes better understood by reference to the following detailed description when taken in conjunction with the accompanying drawings wherein.

DESCRIPTION OF THE PREFERRED EMBODIMENT

Figure 1:
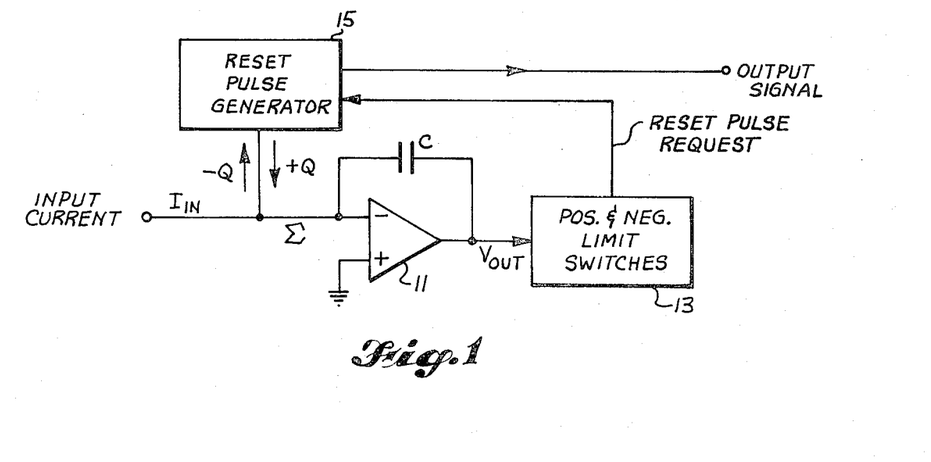
FIG. 1 is a partially schematic and partially block diagram illustrating a reset integrator I/F converter formed in accordance with the invention.

FIG. 1 is a block diagram illustrating a reset integrator I/F converter formed in accordance with the invention and comprises: an operational amplifier 11; positive and negative limit switches 13; and a reset pulse generator 15. Input current ($I_{IN}$) is applied to a summing junction ($\Sigma$) connected to the inverting ($-$) input of the operational amplifier 11 and to one side of an integrating capacitor, C The non-inverting ($+$) input of the operational amplifier 11 is connected to ground. The output of the operational amplifier ($V_{OUT}$) is applied to the other side of the integrating capacitor and to the positive and negative limit switches 13.

The positive and negative limit switches are connected to the reset pulse generator 15. The reset pulse generator is connected to the summing junction ($\Sigma$) and to an output terminal designated OUTPUT SIGNAL.

In operation, $I_{IN}$ is integrated by the conventional operation of the operational amplifier 11 and the integrating capacitor C. The resulting charge is stored by C. When $V_{OUT}$ reaches a predetermined level, either positive or negative, the appropriate limit switch applies a reset pulse request to the reset pulse generator 15. Upon receipt of a reset pulse request, the reset pulse generator 15 causes a precise charge Q to be delivered to the summing junction ($\Sigma$). The polarity of Q may be either positive or negative, depending upon the direction of the input current, which, in turn, controls whether or not $V_{OUT}$ is positive or negative. In any event, the polarity of Q is such that the voltage on C and, thus, the magnitude of $V_{OUT}$ is reduced when Q is dumped into the summing junction. At the same time that Q is dumped, an output pulse is applied to the OUTPUT SIGNAL terminal by the reset pulse generator. Because each output pulse corresponds to an integrated charge, the output pulse frequency is proportional to the input current.

In the past, for bi-directional current operation, the reset pulse generator has been formed by two conceptually identical, but physically different, circuits using different components. Because the actual circuits were different, asymmetry depended upon how closely the components were matched. While matching at a specific temperature is not particularly difficult, choosing components that remain matched over wide temperature is extremely difficult. Because of this difficulty, in the past, precision reset integrator I/F converters have been housed in a temperature stable environment. As will be better understood from the following description of a preferred embodiment of the reset pulse generator, asymmetry problems are essentially eliminated using the present invention without requiring the housing of the inventive structure in a temperature stable environment.

Figure 2:
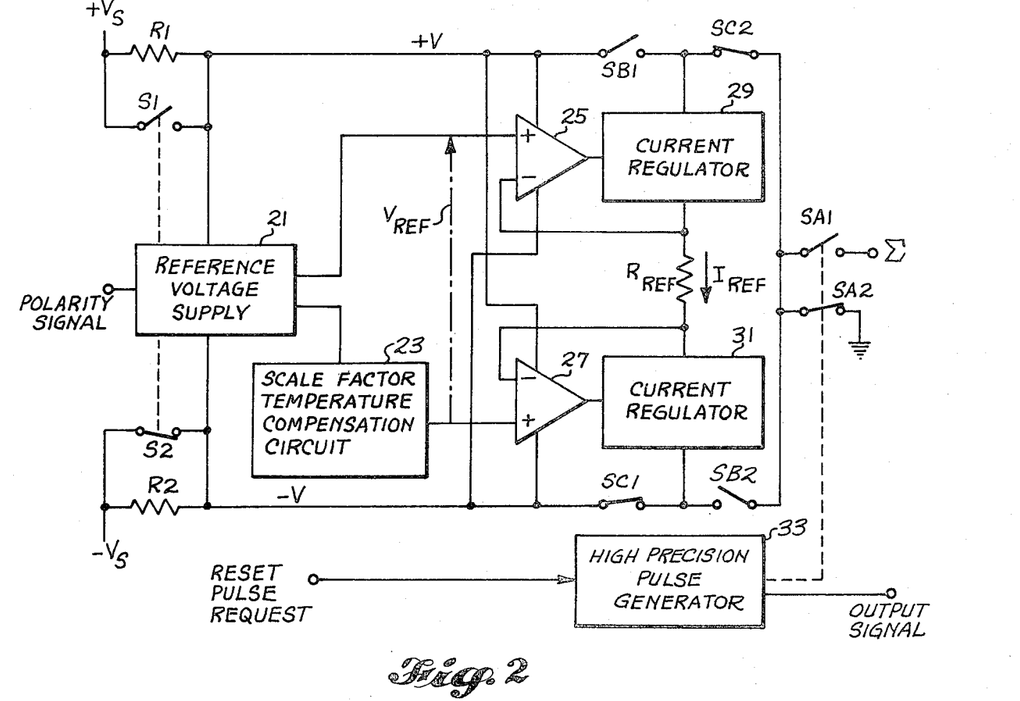
FIG. 2 is a partially block and partially schematic diagram illustrating a reset pulse generator formed in accordance with the invention and suitable for use in the reset integrator I/F converter illustrated in FIG. 1; and, FIG. 3 is a schematic diagram of the bi-directional current source portion of the reset pulse generator illustrated in FIG. 2, slightly modified in form.

FIG. 2 is a block diagram of a reset pulse generator formed in accordance with the invention and comprises: a reference voltage supply 21; a scale factor temperature compensation circuit 23; first and second operational amplifiers 25 and 27; first and second current regulators 29 and 31; and, a high precision pulse generator 33. Also illustrated in FIG. 2 are three resistors designated R1, R2 and $R_{REF}$ and eight single pole switches designated S1, S2, SA1, SA2, SB1, SB2, SC1 and SC2. For simplicity, the switches have been illustrated as simple mechanical contacts in FIG. 2; however, in an actual embodiment, the switches would be electronic switches, such as semi-conductor switches, for example.

A positive voltage source designated $+V_S$ is connected to one side of R1. The other side of R1 is designated $+V$ and is connected to the reference voltage supply 21, the positive power inputs of the first and second operational amplifiers 25 and 27, and one side of SB1. S1 is connected in parallel with R1. A negative voltage source designated $-V_S$ is connected to one side of R2. The other side of R2 is designated $-V$ and is connected to the reference voltage supply 21, the negative power inputs of the first and second operational amplifiers 25 and 27 and one side of SC1. S2 is connected in parallel with R2. In addition, the referenced voltage supply receives a polarity signal at an input terminal designated polarity. The polarity signal may be obtained by sensing the polarity of the voltage at $V_{OUT}$ (FIG. 1), which, of course, is related to the direction of the incoming current, $I_{IN}$.

A first output of the reference voltage supply 21 is connected to the non-verting (+) input of the first operational amplifier 25. A second output of the reference voltage supply 21 is connected through the scale factor temperature compensation circuit 23 to the non-inverting (+) input of the second operational amplifier 27. The voltage across the non-inverting inputs of the first and second operational amplifiers is designated $V_{REF}$ and is a reference voltage that control the current regulators 29 and 31.

The output of the first operational amplifier 25 is connected to the control input of the first current regulator 29. The output of the second operational amplifier 27 is connected to the control input of the second current regulator 31. The current regulators have input and output terminals and control current flow in the direction designated by the arrow denoted $I_{REF}$. This current flow direction is the same regardless of the direction of the input current, even through the direction of the current flow into and out of the summing junction changes as herein described.

The input terminal of the first current regulator 29 is connected to the other side of SB1 and one side of SC2. The output terminal of the first current regulator 29 is connected to the inverting (−) input of the first operational amplifier 25 and to one terminal of $R_{REF}$. The input terminal of the second current regulator 31 is connected to the inverting (−) input of the second operational amplifier 27 and the other side of $R_{REF}$. The output terminal of the second current regulator 31 is connected to the other side of SC1 and one side of SB2. The other sides of SC2 and SB2 are connected together. The junction between SB2 and SC2 is also connected to one side of SA2 and one side of SA1. The other side of SA2 is connected to ground and the other side of SA1 is connected to the summation junction ($\Sigma$) illustrated in FIG. 1 and previously described.

The high precision pulse generator 33 is adapted to receive the reset pulse request from the positive and negative limit switches 13 illustrated in FIG. 1. In accordance therewith, the high precision pulse generator reverses the open and closed positions of SA1 and SA2 and allows a charge of appropriate polarity to be dumped into the summation junction. More specifically, normally SA2 is closed and SA1 is open. When in this state, as will be better understood from the following description, current flows either from gound to $-V$ or from $+V$ to ground, depending on the states of SB1, SB2, SC1 and SC2, one set being closed and the other being open as hereinafter described. When the high precision pulse generator 33 generates an output pulse, it opens SA2 and closes SA1 whereby this current flow causes a charge to be dumped into (or withdrawn from) the summation junction. This charge Q is equal to $I_{REF} \cdot \Delta T$ where $I_{REF}$ is the current flow through $R_{REF}$ and $\Delta T$ is the period of time this current is applied to $\Sigma$. In addition, each time SA1 and SA2 change switch states, the high precision pulse generator produces an output pulse.

Turning now to a more complete description of the operation of the system illustrated in FIG. 2, operational amplifiers 25 and 27 form comparators which control the flow of the reference current $I_{REF}$ through $R_{REF}$ to a value that, except for voltage offsets and input current biases in the first and second operational amplifiers, is given by the equation $I_{REF} = V_{REF}/R_{REF}$.

Figure 3:
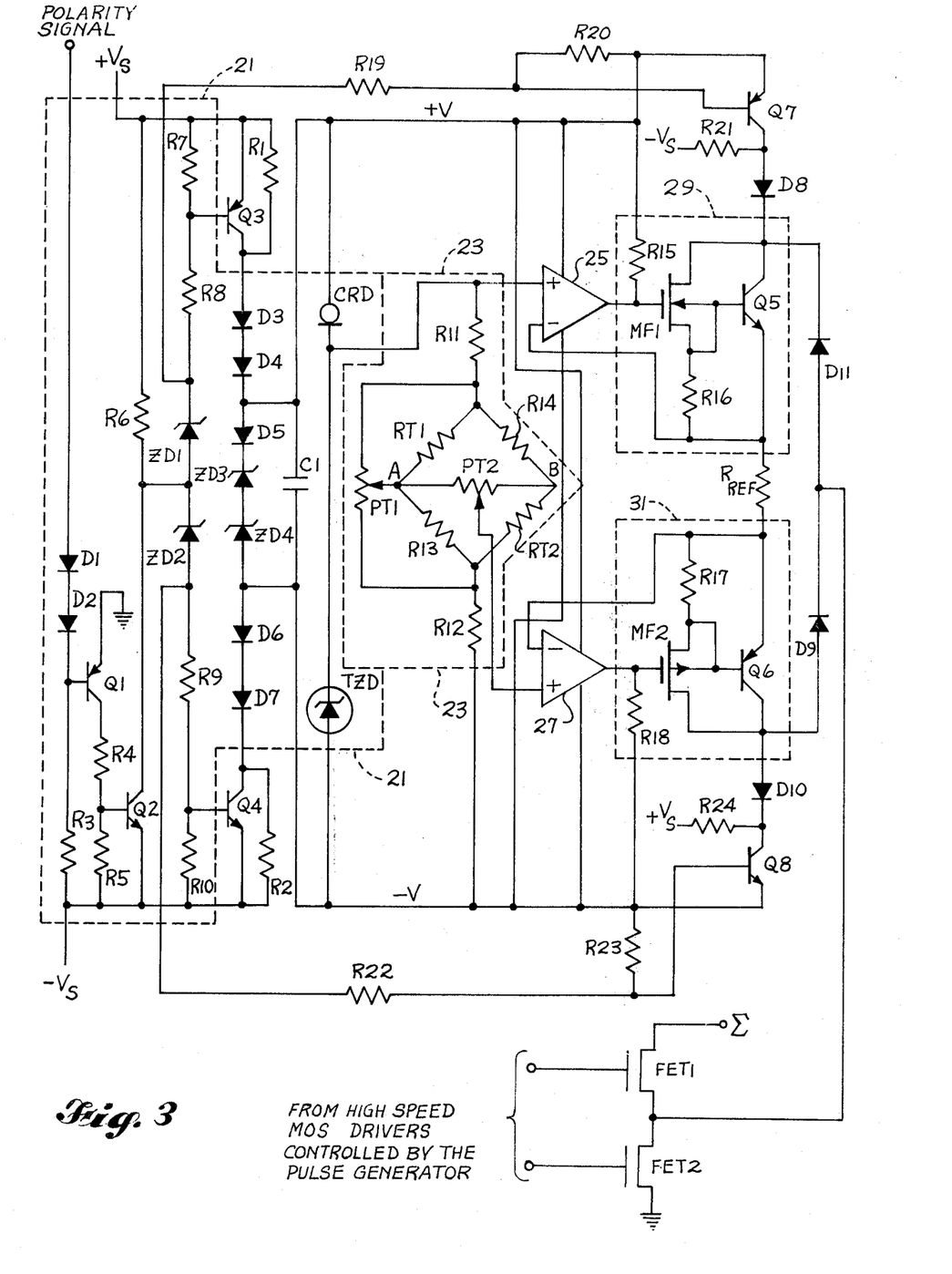

If it is assumed that integrator output voltage $V_{OUT}$ is negative, the polarity input to the referenced voltage supply 21 is negative. This negative voltage causes the reference voltage supply to close S2 and open S1. In addition, a suitable voltage sensing control means (not shown) senses this negative polarity voltage and, in accordance therewith, closes SC1 and SC2 and opens SB1 and SB2. A circuit that functionally accomplishes this result is illustrated in FIG. 3 and hereinafter described.

With the foregoing circuit configuration, $I_{REF}$ flows from ground through SA2, SC2, the first current regulator 29, $R_{REF}$, the second current regulator 31 and SC1 to $-V$. When $V_{OUT}$ reaches the reset limit, the pulse request it produces causes the high precision pulse generator 33 (the timing of which may be controlled by a crystal oscillator) to open SA2 and close SA1 during some exact time interval $\Sigma T$. During this time interval a charge, $-Q$, determined by the equation $Q = I_{REF} \cdot \Delta T$ is drawn from the summing junction of the integrator causing the charge on C to reset to a lower level, thereby reducing $V_{OUT}$. Each time $V_{OUT}$ reaches the reset limit this cycle is repeated Since the time required for $V_{OUT}$ to increase in magnitude from its reduced value to its reset value is directly related to the magnitude of the input current, the SA1/SA2 switching rate is directly related to this current. Since the high precision pulse generator delivers output pulses at the same rate, the rate or frequency of the output pulses is directly related to the magnitude of $I_{IN}$.

When a reset charge of the opposite polarity is required, the direction of the input polarity will be positive, causing S1, SB1 and SB2 to close and S2, SC1 and SC2 to open. The current direction $I_{REF}$ will then flow from $+V$ through the first current regulator 29, $R_{REF}$, the second current regulator 31, SB2 and SA2 to ground. As before, a pulse request will cause the high precision pulse generator to open SA2 and close SA1 during a time $\Delta T$ during which a positive charge $+Q = I_{REF} \cdot \Delta T$ will be dumped into the summing junction $\Sigma$.

It will be appreciated from viewing FIG. 2 and the foregoing discussion that $I_{REF}$, except for the switches, flows through exactly the same circuitry in the same direction. Thus, the charge, Q, dumped into (or withdrawn from) the summing junction $\Sigma$ during the precise time interval $\Delta T$ is exactly the same for either direction, assuming the magnitude of $I_{REF}$ is the same. $\Delta T$ is the same for either input current direction because the same high precision pulse generator 33 controls SA1 and SA2, regardless of the direction of the converter input current.

It will also be appreciated from viewing FIG. 2 that the first and second amplifiers 25 and 27 are powered by the same +V and −V voltages. Because these voltages follow the reference voltage fluctuations, common mode voltage difference problems which could occur if, for example, the first and second amplifiers were instead supplied by $+V_S$ and $-V_S$, do not occur. Furthermore, any offset voltage drift in the first and second amplifiers will have no detrimental affect on asymmetry because these amplifiers are affected the same regardless of voltage polarity.

Because of the foregoing features, the invention eliminates the need for the closely matching of components. In addition, it is normally unnecessary to mount the current-to-frequency converter of the invention in a temperature controlled environment. If desired, scale temperature dependence can be balanced out utilizing the scale factor temperature compensation circuit 23. A preferred embodiment of a scale factor temperature compensation circuit is illustrated in FIG. 3 and hereinafter described.

FIG. 3 is a schematic diagram illustrating, in more detail, the bi-directional current source portion of the reset pulse generator illustrated in FIG. 2. More specifically, FIG. 3 is a schematic diagram of: a reference voltage supply 21; a scale factor temperature compensation circuit 23; and, first and second current regulators 29 and 31, plus first and second operational amplifiers 25 and 27 and semiconductor elements that perform the functions of S1, S2, SA1, SA2, SB1, SB2, SC1 and SC2.

The reference voltage supply 21 illustrated in FIG. 3 comprises: seven diodes designated D1–D7; a PNP transistor designated Q1; an NPN transistor designated Q2; four zener diodes designated ZD1–ZD4; eight resistors designated R3–R10; a current regulating field effect diode designated CRD; a temperature compensated zener diode designated TZD; and, a capacitor designated C1. FIG. 3 also includes R1 and R2; and, a pair of switching transistors, a PNP transistor designated Q3 and an NPN transistor designated Q4, which perform the functions of S1 and S2, respectively.

The polarity signal terminal is connected to the anode of D1. The cathode of D1 is connected to the anode of D2 and the cathode of D2 is connected through R3 to $-V_S$. The junction between D2 and R3 is connected to the base of Q1. The emitter of Q1 is connected to ground and the collector Q1 is connected through R4 in series with R5 to $-V_S$. The junction between R4 and R5 is connected to the base of Q2. The collector of Q2 is connected through R6 to $+V_S$ and the emitter of Q2 is connected to $-V_S$.

The junction between R6 and the collector of Q2 is connected to the anode of ZD1 and the cathode of ZD2. The cathode of ZD1 is connected through R8 in series with R7 to $+V_S$. The anode of ZD2 is connected through R9 in series with R10 to $-V_S$. The junction between R7 and R8 is connected to the base of Q3 and the junction between R9 and R10 is connected to the base of Q4. The emitter of Q3 is connected to $+V_S$ and the emitter of Q4 is connected to $-V_S$. R1 is connected in parallel with the emitter/collector terminals of Q3 and R2 is connected in parallel with the emitter/collector terminals of Q4.

The collector of Q3 is connected to the anode of D3, the cathode of D3 is connected to the anode of D4, the cathode of D4 is connected to the anode of D5 and the cathode of D5 is connected to the cathode of ZD3. The anode of ZD3 is connected to the cathode of ZD4 and the anode of ZD4 is connected to the anode of D6. The cathode of D6 is connected to the anode of D7 and the cathode of D7 is connected to the collector of Q4. The junction between D4 and D5 is connected to one side of C1 and the junction between ZD4 and D6 is connected to the other side of C1. +V is formed at the junction between D4 and D5 and −V is formed at the junction between ZD4 and D6.

The junction between D4 and D5 is also connected to the anode of CRD. The cathode of CRD is connected to the cathode of TZD. The anode of TZD is connected to the junction between ZD4 and D6. In many environments, better temperature stability will be achieved if CRD is replaced by a resistor.

In operation, the polarity of the signal at the polarity input terminal controls whether or not Q1 is in an on state or an off state. This control in turn controls whether or not Q2 is in an on or off state. Q2 in turn, via ZD1 and R7 and R8, or ZD2 and R9 and R10, controls whether or not Q3 or Q4 is on or off. If one (e.g. Q3) is on, the other (e.g. Q4) is off and vice versa. The on or off state of Q3 and Q4, in turn, determine whether R1 and R2 are or are not shorted. This action in turn controls the magnitude of the voltages at the ends of C1 and, thus, +V and −V. This control system causes the reference voltage supply 21 to provide +V and −V voltages adapted to perform the functions previously discussed with respect to FIG. 2.

The scale factor temperature compensation circuit 23 comprises: four resistors designated R11–R14; two temperature compensation resistors designated RT1 and RT2; and, two potentiometers designated PT1 and PT2. RT1, RT2, R13 and R14 form a bridge circuit with the temperature dependent resistors located in opposing arms of the bridge. The junction between CRD and TZD is connected through R11 to one of the bridge terminals, specifically the junction between RT1 and R14. The opposing bridge teminal (the junction between R13 and RT2) is connected through R12 to −V. PT1 is connected across this opposing pair of bridge terminals and its slider is connected to one of the other bridge terminals, specifically the junction between RT1 and R13 or point A in FIG. 3. PT2 is connected from point A to the other bridge terminal, or point B. The slider of PT2 is connected to the non-inverting (+) input of the second operational amplifier 27. The junction between CRD and TZD is also connected to the non-inverting (+) input of the first operational amplifier 25.

Turning now to a description of the operational of the scale factor temperature compensation circuit 23, the temperature compensated zener diode, TZD, provides a reference voltage to the bridge. R13 and R14 are low temperature compensation resistors and RT1 and RT2 are high temperature compensation resistors. Temperature compensation is accomplished by first adjusting PT1 for a zero voltage between points A and B at some fixed temperature (for example, room temperature). The scale factor is noted at this temperature and, thereafter, the temperatue is changed to a different suitable level. At this level, the scale factor is trimmed to agree with the previous reading by adjusting PT2. This procedure facilitates scale factor compensation because the scale factor at the first fixed temperature (e.g. room temperature) is unaffected by the position of PT2, since the voltage between points A and B is zero.

As noted in the previous description of the reset pulse generator illustrated in FIG. 2, the positive power inputs of the first and second operational amplifiers 25 and 27 are connected to +V and the negative power inputs are connected to −V. The inverting (−) input of the first operational amplifier 25 is connected to one side of $R_{REF}$ and the inverting (−) input of the second operational amplifier 27 is connected to the other side of $R_{REF}$.

The first current regulator 29 comprises: two resistors designated R15 and R16; a N-channel metal oxide semiconductor field effect transistor (MOSFET) designated MF1; and, a NPN transistor designated Q5. The gate of MF1 is connected to the output of the first operational amplifier 25 and through R15 to +V. The source terminal of MF1 is connected to the collector of Q5, and the drain terminal is connected through R16 to the inverting (−) input of the first operational amplifier 25 and to the emitter of Q5. The substrate terminal of MF1 is connected to its drain terminal and to the base of Q5.

The second current regulator 31 comprises: two resistors designated R17 and R18; a P-channel MOSFET designated MF2; and, a PNP transistor designated Q6. The output of the second operational amplifier 27 is connected to the gate of MF2 and through R18 to −V. The source terminal of MF2 is connected through R17 to the inverting (−) input of the second operational amplifier 27 and to the emitter of Q6. The drain terminal of MF2 is connected to the collector of Q6. The substrate terminal of MF2 is connected to its source terminal and to the base of Q6. $R_{REF}$ is connected between the emitters of Q5 and Q6.

The first and second current regulators 29 and 30 illustrated in FIG. 3 are relatively conventional circuits wherein the MOSFETs provide high input impedance to the outputs of the operational amplifiers and are used to control the magnitude of the current passed by Q5 and Q6.

The functions of SB1 and SB2 illustrated in FIG. 2 are performed by a circuit comprising: three resistors designated R19, R20 and R21; two diodes designated D8 and D9; and, a PNP transistor designated Q7. R19 is connected from the junction between R8 and ZD1 of the reference voltage supply to the base of Q7. R20 is connected between the base of Q7 and +V. The emitter of Q7 is connected to +V. The collector of Q7 is connected through R21 to $-V_S$ and to the anode of D8. The anode of D9 is connected to the collector of Q6.

The functions of SC1 and SC2 illustrated in FIG. 2 are provided by a circuit comprising: three resistors designated R22, R23, and R24; two diodes designated D10 and D11; and, a NPN transistor designated Q8. The base of Q8 is connected through R22 to the junction between ZD2 and R9 of the reference voltage supply. The base of Q8 is also connected through R23 to −V. The emitter of Q8 is connected to −V. The collector of Q8 is connected through R24 to $+V_S$ and to the cathode of D10. The anode of D10 is connected to the collector of Q6. The cathode of D11 is connected to the emitter of Q5, and the anode of D11 is connected to the cathode of D9.

In operation, the voltages at the junctions between R8 and ZD1 and between R9 and ZD2 control whether or not Q7 and Q8 are on or off. These voltages in turn are determined by the polarity of the signal applied to the signal polarity terminal and are such that when Q7 is on Q8 is off and vice versa.

The functions of SA1 and SA2 of FIG. 2 are performed by two bi-directional field effect transistors designated FET1 and FET2. The source/drain terminals of FET1 and FET2 are connected in series between ground and the summation junction (Σ) of the integrator illustrated in FIG. 1. The junction between FET1 and FET2 is connected to the junction between D9 and D11. The gates of FET1 and FET2 are connected to receive control signals adapted to cause FET 1 and FET 2 to perform the functions of SA1 and SA2 illustrated in FIG. 2. The signals may be received from high speed MOS drivers controlled by the high precision pulse generator illustrated in FIG. 2. In any event, the FET1 and FET2 control the dumping (or withdrawing) of a charge Q for a predetermined time period ΔT into the integrator capacitor C by applying $I_{REF}$ to the summing junction. The polarity of the charge, as previously described, is controlled by the direction of current flow through the current regulator circuits. This direction is controlled by the on/off states of Q7 and Q8 which states are controlled by the polarity of the signal received at the polarity signal terminal, as just described.

It will be appreciated from the foregoing description that FIG. 3 illustrates a specific circuit adapted to carry out the functional operations illustrated in FIG. 2 and previously described. However, the invention should not be construed as limited to the specific circuit illustrated in FIG. 3 since various modifications can be made without departing from the spirit and scope of the invention. For example, the switching circuits which perform the functions of SB1 SC1, SB2 and SC2 could be replaced by field effect transistor switches driven by the pulse generator, if desired. In addition, various other changes can be made as will be recognized to those skilled in the art. Hence, the invention can be practiced otherwise than as specifically described herein.

Further, it will be readily appreciated that the invention, while described primarily in a current-to-frequency environment, can also be utilized to form a voltage-to-frequency V/F converter. In this regard, as noted above, as used herein, the term current is considered generic to current and voltage because all that needs to be done to create a V/F converter is to insert a resistor in series with the input of the integrator illustrated in FIG. 1. The input current will then be determined by the voltage across the resistor and a voltage-to-frequency conversion function will be performed, rather than a current-to-frequency conversion function.

The embodiments of the invention in which an exclusive property or privilege is claimed are defined as follows:

1. In a reset integrator converter wherein the output of an integrator is sensed and a reset pulse request created when the magnitude of said output reaches a predetermined level, the improvement comprising a bi-directional reset pulse generator, said bi-directional reset pulse generator comprising:
   a. a bi-directional current path means for supplying a charge of either positive or negative polarity to the input of said integrator, said bi-directional current path means primarily formed of common components; and,
   b. control means for:
      i. controlling the flow of current in said bi-directional current path means in accordance with the nature of the input to said integrator;
      ii. receiving said reset pulse request; and,
      iii. connecting said bi-directional current path means to the input of said integrator so as to apply a reducing charge to said integrator for a predetermined time period.

2. The improvement claimed in claim 1, wherein said bi-directional current path means includes switching means for controlling the polarity of the charge supplied to the input of said integrator by said bi-directional current path means.

3. The improvement claimed in claim 2 wherein said control means includes a reference voltage supply adapted to sense the nature of the input supplied to said integrator and, in accordance therewith, control the magnitude of the current flowing in said bi-directional current path means.

4. The improvement claimed in claim 3 wherein said reference voltage supply also generates positive and negative voltages and a reference voltage, and further including first and second operational amplifiers connected to receive said reference voltage across common inputs.

5. The improvement claim in claim 4 wherein said bi-directional current path means includes a first current regulator having its input connected to the output of said first operational amplifier, a second current regulator having its input connected to the output of said second operatonal amplifier and a reference resistor, said reference resistor, said first current regulator and said second current regulator being connected in series and forming said common components of said bi-directional current path means, said first current regulator being connected to the other input of said first operational amplifier and said second current regulator being connected to the other input of said second operational amplifier.

6. The improvement claimed in claim 5 wherein said bi-directional current path means is connected to ground and wherein said switching means is adapted to control the connection of said positive and negative voltages created by said reference voltage supply to said bi-directional current path means so as to create a current flow therethrough.

7. The improvement claimed in claim 6 wherein said control means includes a high precision pulse generator that disconnectes said bi-directional current path means from ground as it connects said bi-directional current path means to said integrator to dump a charge into or withdraw a charge from said integrator.

8. The improvement claimed in claim 7 including a scale factor temperature compensaton circuit connected between said reference voltage supply and one of the common inputs of said first and second operational amplifiers.

9. A bi-directional reset integrator convertor comprising:
   an integrating amplifier having an input summing junction for receiving an electrical input and for receiving a voltage reducing charge, said integrating amplifier including an amplifier and an integrating capacitor connected in a feedback manner to said amplifier, said integrating capacitor storing a charge during the integrating process;
   sensing means for sensing the magnitude of the charge stored by said integrating capacitor and for generating a reset pulse request when said magnitude reaches a predetermined level, either positive or negative; and
   a reset pulse generator suitable for applying either a positive or negative voltage reducing charge to said summing junction upon receipt of a reset pulse request, the polarity of said charge being determined by the polarity of the charge stored by said capacitor, said reset pulse generator including a bi-directional current path means formed of common components and control means for:
      i. controlling the flow of current in said bi-directional current path means in accordance with the polarity of the voltage stored by said integrating capacitor;
      11. receiving said reset pulse request; and,
      iii. connecting said bi-directional current path means to said summing junction upon receipt of a reset pulse request.

10. A bi-directional reset integrator connecter as claimed in claim 9, wherein said bi-directional current path means includes switching means for controlling the direction of current flow in said bi-directional current path means.

11. A bi-directional reset integrator converter as claimed in claim 10 wherein said control means includes a reference voltage supply adapted to sense the nature of the input supplied to said integrator and, in accordance therewith, control the magnitude of the current flowing in said bi-directional current path means.

12. A bi-directional reset integrator converter as claimed in claim 11 wherein said reference voltage supply also generates positive and negative voltages and a reference voltage, and further including first and second operational amplifiers connected to receive said reference voltage across common inputs.

13. A bi-directional reset integrator converter as claimed in claim 12 wherein said bi-directional current path means includes a first current regulator having its input connected to the output of said first operational amplifier, a second current regulator having its input connected to the output of said second operational amplifier and a reference resistor, said reference resistor, said first current regulator and said second current regulator being connected in series and forming said common components of said bi-directional current path means, said first current regulator being connected to the other input of said first operational amplifier and said second current regulator being connected to the other input of said second operational amplifier.

14. A bi-directional reset integrator converter as claimed in claim 13 wherein said bi-directional current path means is connected to ground and wherein said switching means is adapted to control the connection of said positive and negative voltages created by said reference voltage supply to said bi-directional current path means so as to create a current flow therethrough.

15. A bi-directional reset integrator converter as claimed in claim 14 wherein said control means includes a high precision pulse generator that disconnects said bi-directional current path means from ground as it connects said bi-directional current path means from ground as it connects said bi-directional current path means to said integrator to dump a charge into or withdraw a charge from said integrator.

16. A bi-directional reset integrator converter as claimed in claim 15 including a scale factor temperature compensation circuit connected between said reference voltage supply and one of the common inputs of said first and second operational amplifiers.

* * * * *

UNITED STATES PATENT AND TRADEMARK OFFICE
CERTIFICATE OF CORRECTION

PATENT NO. : 3,989,961
DATED : November 2, 1976
INVENTOR(S) : C. Johan Masreliez It is certified that error appears in the above-identified patent and that said Letters Patent are hereby corrected as shown below:

Column 9, line 9, "temperatue" should be --temperature--.

Column 11, line 42, "claim" should be --claimed--;
line 47, "operatonal" should be --operational--;
line 65, "disconnectes" should be --disconnects--; and, Column 12, line 33, "11." should be --ii.--.

Signed and Sealed this

Twenty-second Day of February 1977

[SEAL]

Attest:

RUTH C. MASON
Attesting Officer

C. MARSHALL DANN
Commissioner of Patents and Trademarks